(12) United States Patent
Hayes

(10) Patent No.: US 6,673,260 B2
(45) Date of Patent: *Jan. 6, 2004

(54) HEAT ABSORBING TEMPERATURE CONTROL DEVICES AND METHOD

(76) Inventor: Claude Q. C. Hayes, 3737 Third Ave., No. 308, San Diego, CA (US) 92103

( * ) Notice: Subject to any disclaimer, the term of this patent is extended or adjusted under 35 U.S.C. 154(b) by 0 days.

This patent is subject to a terminal disclaimer.

(21) Appl. No.: 09/808,269

(22) Filed: Mar. 14, 2001

(65) Prior Publication Data

US 2002/0081402 A1 Jun. 27, 2002

Related U.S. Application Data

(60) Division of application No. 09/558,732, filed on Apr. 26, 2000, now Pat. No. 6,224,784, which is a continuation-in-part of application No. 08/709,516, filed on Sep. 6, 1996, now abandoned.
(60) Provisional application No. 60/003,387, filed on Sep. 7, 1995.

(51) Int. Cl.[7] .............................. C09K 5/18; H05K 5/02
(52) U.S. Cl. ..................... 252/70; 165/10; 165/104.17; 165/902; 165/905; 174/17 SF; 174/17 LF; 361/701; 432/4; 432/12
(58) Field of Search .............................. 252/70; 165/10, 165/905, 104.17, 902; 432/4, 12; 174/17 SF, 17 LF; 361/701

(56) References Cited

U.S. PATENT DOCUMENTS 4,292,189 A * 9/1981 Chen .......................... 252/70
4,360,442 A * 11/1982 Reedy et al. ................ 126/400
4,877,681 A 10/1989 Hanada et al.
5,085,790 A 2/1992 Hormansdorfer
5,372,846 A 12/1994 Feldman et al.
5,932,839 A * 8/1999 Ren et al. ................ 174/17 SF
6,078,011 A * 6/2000 Ren et al. .................... 174/175
6,143,978 A * 11/2000 Ren et al. ................ 174/17 SF
6,153,720 A * 11/2000 Olzak et al. ................. 528/182
6,235,216 B1 * 5/2001 Hayes .......................... 252/70

FOREIGN PATENT DOCUMENTS

| DE | 1913884 | * | 10/1970 |
| DE | 3233144 | * | 3/1984 |
| JP | 55-92782 | * | 7/1980 |
| JP | 59-213789 | * | 12/1984 |
| JP | 1-292090 | * | 11/1989 |
| JP | 6-220436 | * | 8/1994 |
| WO | WO-99/11455 | * | 3/1999 |

* cited by examiner

Primary Examiner—Anthony J. Green
(74) Attorney, Agent, or Firm—McCarter & English, LLP

(57) ABSTRACT

The increase of temperature in heat sensitive devices during heat generating conditions is prevented through the absorption of heat, by providing Carbonate Salts in an amount sufficient to effect the required heat absorption. Where the heat generating conditions are generated by a heat generator, separate and distinct from the heat sensitive device, the Carbonate Salt is supported in a position between the heat sensitive device and the heat generator. Where the heat sensitive device is itself the heat generator, the Carbonate Salt is contacted to the heat sensitive device either directly or indirectly.

49 Claims, 7 Drawing Sheets

Test of Flight Recorder Heatsink Without Endotherm

Temperature Properties of Boric Acid

HEAT ABSORBING TEMPERATURE CONTROL DEVICES AND METHOD

RELATED APPLICATIONS

The application is a divisional of U.S. patent application Ser. No. 09/558,732 filed on Apr. 26, 2000, now U.S. Pat. No. 6,224,784, which in turn was a Continuation-In-Part of U.S. patent application Ser. No. 08/709,516 filed on Sep. 6, 1996, now abandoned, which in turn claims the benefit of U.S. Provisional Application Serial No. 60/003,387 filed on Sep. 7, 1995.

BACKGROUND OF THE INVENTION

The present invention relates to heat absorbing devices and a method for constructing same. Said heat absorbing devices have heat absorbing chemicals, i.e. endotherms, which use their respective heats of reaction to cool and maintain and control the temperature and heat of heat sensitive devices. These endotherms comprise certain acids and their salts, certain bases and their salts, and certain organic compounds, which have never before been used in the manner described, disclosed and claimed below.

Often, active cooling of such electronic components, particularly delicate TR modules, Impatt diodes, data recorders, containers for chemicals and munitions, batteries and the like, is not feasible; and even when it is feasible, it requires continuous high energy cooling, which taxes other ancillary engineering systems typical in missiles, aircrafts, railroads, trucks, automobiles, guns, nuclear reactor systems, related combat systems, as well as commercial systems and technology.

The heat sinks of the prior art generally employ phase change material compositions (PCMs) for the absorption and dissipation of heat. The conventional PCM materials are largely solid or fluidic in nature, i.e. liquids, quasi-liquids, or solids such as waxes or other meltable compositions. However, these conventional PCMs have proven to suffer from many technical problems, as well as problems in their use and application. These problems include relatively low latent heats of fusion, the inability to control the shape and form of such fluid PCM materials, as well as the unevenness of heating and cooling. Other problems include the need to provide a containment housing and the stress placed on the housing, resulting in frequent rupture and spillage of the PCM; the hazard to life and property due to PCMs' high heat content and flammability; and lastly, the uneven cooling hysteresis.

In addition, the known PCMs can spill hot fluids onto a human's skin, resulting in serious third degree burns due to the sticky contact nature of many hot wax and polymer or plastic phase change materials (PCMs) and the high heat and sticky adherence to the skin. Ruptured non-Composite Fabric Endothermic Material (CFEM) or liquified bulk PCM disks spill their content and cause flash fires, which spread as the PCM pours out during heating in ovens and wax-filled disks are prone to fires, which can spread and flow out of stoves.

Applicant has addressed some of these and other PCM problems in his, U.S. Pat. No. 4,446,916. Applicant has disclosed what he calls a composite fabric endothermic material (CFEM), providing devices especially suitable as heat sinks for aerospace and military use. The patented CFEM provides an improved heat sink that absorbs heat at the melting temperatures of a compound embedded within a fibrous mesh or matrix. The CFEM preferably comprises a phase change material, which is held by capillary action and chemical adhesion to the fibers of the matrix. As a result a greatly increased surface area for heat transfer is obtained; thus providing for controlled melting and thermal dissipation of the fusion cooling agent.

Applicant has also addressed some of the PCM problems in his pending U.S. patent application Ser. No. 0/811,106, now U.S. Pat. No. 5,709,914, the disclosure and contents of which are incorporated herein as if more fully set forth. Such application addresses the need for an improved recyclable endothermic/exothermic thermal storage method for use in many commercial and civilian applications, particularly for food, home and commercial packaging operations. In this application, improved CFEMs are disclosed, capable of being employed in a variety of commercial applications such as in the food industry where a need has arisen for heat retaining or heat insulating containers, packages and thermal storage devices.

However, the active agents suggested in Applicant's pending U.S. patent application Ser. No. 08/811,106, now U.S. Pat. No. 5,709,914 are not useful in the present inventive heat absorbing devices, as they are concomitantly both endotherms and exotherms. i.e. first, they absorb heat and then they give off heat to the item in connection with which they are being used, for the purpose of maintaining it warm.

While they can accomplish some protection from high temperatures through the physical phenomenon of the absorption of their latent heat of fusion, wherein the appropriate crystalline substance absorbs a quantity of heat to melt without a temperature rise to its surroundings, they are totally unsuitable for applications relating to the absolute protection of heat sensitive devices from high heat. After all, the heat they have absorbed, they must release. In other words, not only do they absorb heat but they also release heat, particularly when confined in a closed environment.

Another problem with the active agents of Applicant's U.S. pending patent application Ser. No. 08/811,106, now U.S. Pat. No. 5,709,914 and the prior art PCMs is that they are not capable of absorbing more than 200 cal/gm. Thus, they can remove heat for only a short period of time relative to mass and only at temperatures not exceeding 326° F. Consequently, they are not effective for applications requiring cooling at very high temperatures and for long periods of time as would be needed, for example, in airplane and railroad crash recorders, missile electronics, spacecraft devices, power supplies, data recorders employed as aircraft and railroad components and combat devices, and in commercial uses such as oven sensors, fire walls, nuclear reactors, munitions' boxes, chemical containers, batteries and automobile exhaust systems.

Finally, these latent heat of fusion agents (PCMs) tend to burn at relatively high temperatures raising the overall heat content of the system. In addition, the reversibility of the phenomena virtually guarantees that these agents will also transfer heat into the heat sensitive devices once said devices are at a lower temperature than the respective temperatures of the agents. Consequently, not only do these agents operate as heat absorbing agents, but in closed environments they also operate as heat transfer agents to cause the very damage to the heat sensitive devices that these agents were intended to protect in the first place. This they do by re-releasing the absorbed heat to the heat sensitive device, thereby increasing the time or duration that the heat sensitive device is exposed to a high heat environment.

It is, therefore, the object of the present invention to overcome the disadvantages set forth above and, in particular, to provide for nonreversible heat absorbing applications.

It is a further object of the present invention to provide improved coolant media for use in heat sensitive devices such as airplane and railroad crash recorders, missile electronics, munitions boxes, clothing, firewalls, safe boxes, nuclear reactors, laser shields, thermal pulse shields, spacecraft devices, power supplies, data recorders employed as aircraft and railroad components, combat devices, as well as in commercial uses such as oven sensors and the like.

It is another object of the present invention to provide heat absorbing agents for use in heat sensitive devices, said heat absorbing agents being capable of absorbing heat at temperatures above 300° F.

It is another object of the present invention to provide heat absorbing devices with mechanisms that utilize the chemical reactions of latent heat of formation, decomposition or dehydration in such mechanisms.

These objects as well as others will be found in detail in the disclosure that follows below.

SUMMARY OF THE INVENTION

According to the present invention a heat absorbing device and method are provided comprising endothermic agents capable of absorbing heat for the cooling and maintenance of the temperature of heat sensitive devices at acceptable levels. Such endothermic agents comprise certain acids and their salts, certain bases and their salts, certain hydrate salts and certain organic compounds. This means that they absorb large quantities of heat to decompose or to dehydrate to either new and simpler, chemically stable chemical compounds, or to their individual component elements.

This ability to absorb heat and irreversibly decompose makes them ideal for the thermal protection of heat sensitive devices in applications where the integrity of the heat sensitive devices must be maintained, under exposure to specified conditions of extreme high heat.

The shape, size and physical characteristics of the heat absorbing devices and likewise the steps of the method are dictated by the type of the heat sensitive device being protected, the heat sensitive device's spacial limitations, the heat sensitive device's physical environment and the heat generating conditions, to which the heat sensitive device will be subjected.

Similarly, the type and the amount of endotherms used in the heat absorbing device and in the method are dictated by the heat sensitivity of the heat sensitive device; the maximum temperature at which the heat sensitive device can continue to be viable at; the extreme temperatures, to which the heat sensitive device will ultimately be subjected; the time for which the heat sensitive device will be exposed to said extreme heat generating conditions; and the total thermal flux or thermal load, to which the heat sensitive device will be subjected.

Preferably, the endotherms can be boric acid; metal hydroxides and their mixtures; carbonates and bicarbonates and their mixtures; salts of acetic acid, salts of formic acid, salts of boric acid, and their mixtures; paraldehyde, paraformaldehyde, and trioxane and their mixtures; and hydrate salts and their mixtures. Further such endotherms can be supported within the device, via a(n) retaining matrix, packaging, encapsulation, microencapsulation, enclosure or structure to form a heat absorbing surface, device or structure.

The heat sensitive devices can be embedded within the endotherms; or they can be surrounded by the endotherms; or the endotherms can line the walls (inner or outer) of the closed container within which the heat sensitive device is placed; or in the alternative, the endotherms can be adhered to a substrate (flexible or non-flexible) capable of being adapted to the size and shape necessary for use with said heat sensitive devices.

DETAILED DESCRIPTION

The features of the present invention will hereinafter be described in detail.

The present invention utilizes non-recyclable, non-reversible, endothermic chemical reactions, which make use of the latent heat of decomposition and dehydration reactions to provide new, improved and particularly, efficacious endothermic cooling systems.

What makes these non-recyclable, non-reversible, endothermic chemical reactions particularly appropriate for use in the inventive heat absorbing device and method, is that these reactions have temperatures of reaction that correspond to the temperature ranges taken into consideration by the design of heat sensitive devices such as flight data recorders, electronics and related devices. Accordingly, the presence of these reactions in the heat absorbing devices insures that said heat absorbing devices act only as heat absorbers and not as heat generators; thereby being capable of maintaining the internal temperature of the heat sensitive devices at a range between 100° C. and 300° C., while said heat sensitive devices are being exposed to an external temperature range of 600° C. to 1100° C.

The compounds developed in the present invention provide endothermic chemical reactions, which are extremely stable in diverse environments, have long shelf life and high latent heats of reaction. Preferably, the compounds contemplated by the present invention include: boric acid and some borate salts; salts of acetic acid and formic acid; hydroxides of lithium, calcium, aluminum and sodium; carbonate salts of magnesium, lithium and silicon; paraldehyde, paraformaldehyde and trioxane; and hydrated salts.

Specifically, the present invention makes a broad claim to a device and method using endothermic agents which thermally decompose as follows:

1. Hydrated salts endothermically decompose to water and salt;
2. Paraldehyde, paraformaldehyde and trioxane endothermically decompose to formaldehyde and thereafter to amorphous carbon, water, carbon dioxide and ethane;
3. Low molecular weight acids endothermically decompose into water and oxides; and
4. Carbonate salts endothermically decompose into carbon dioxide and an oxide.

Generally, the inventive method involves taking an amount of endotherm sufficient to effect the required heat absorption and either contacting said endotherm to the heat sensitive device, or supporting said endotherm between the heat sensitive device and the heat generator so as to absorb the heat and prevent any increase in the temperature of the heat sensitive device. In either case, the amount of endotherm, the type of endotherm, and the location of the endotherm can be determined on the basis of the disclosure set forth below.

I. The following illustrates the endothermic reaction and heat absorption of the aforementioned hydroxides when subjected to a temperature of reaction below 1100° C.

Figure 1:
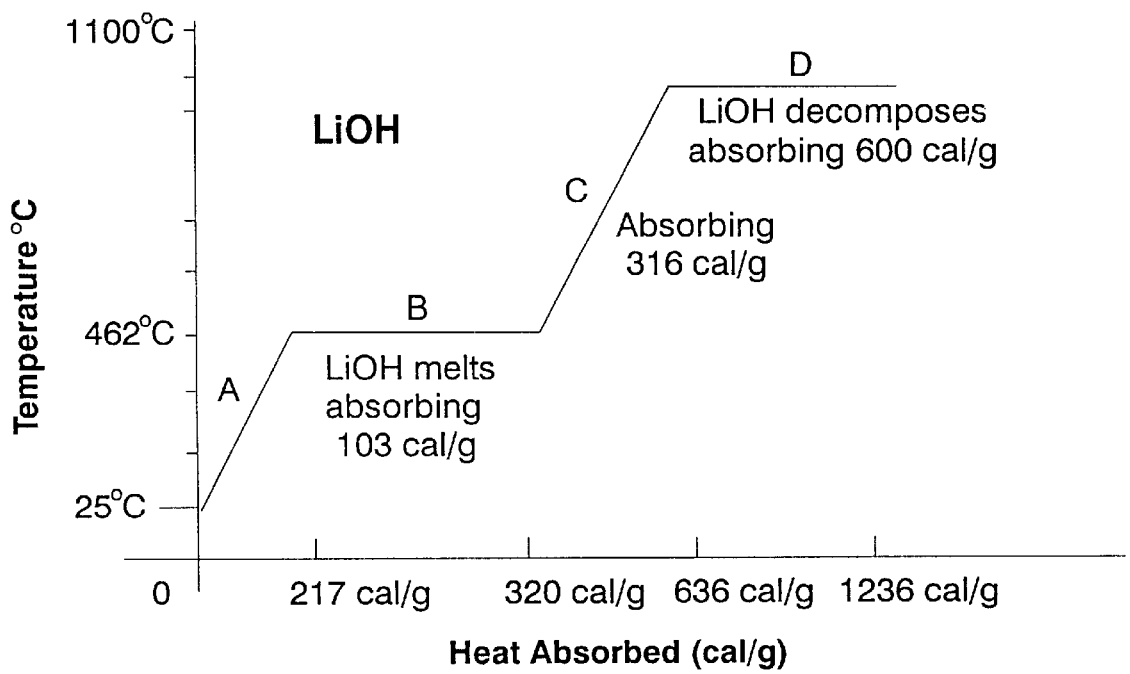
FIG. 1 is an illustrative schematic graph of the four phrases of the heat absorption exhibited by Lithium Hydroxide and the phenomena observed during such phases, when Lithium Hydroxide is used as an endotherm, in accordance with the present invention.

(a) LITHIUM HYDROXIDE: Lithium Hydroxide's use as an endotherm at temperatures below and up to 1100° C. is characterized by at least four phases of heat absorption. FIG. 1 shows these four phases of heat absorption, i.e. A, B, C and D, and the phenomena observed during such phases. It is noted that the slopes of the graph are neither accurate nor precise but are only intended to be illustrative in nature.

Theoretically, the total amount of heat in calories absorbed by LiOH when exposed to temperatures below and up to 1100° C. can be mathematically represented by the following formula:

$$A+B+C+D=Hrx$$

where
- A=the amount of heat in calories absorbed by LiOH prior to melting;
- B=the amount of heat in calories absorbed during actual melting phase of LiOH;
- C=the amount of heat in calories absorbed by LiOH once melting is complete and it begins approaching its temperature of decomposition; and
- D=the actual amount of heat of decomposition of LiOH in calories.

(i) Calculating the Hrx for LiOH:

The amount of heat in calories absorbed during Phase A as LiOH's temperature begins to rise from room temperature i.e. 25° C. to its Melting Point temperature of 462° C. is limited only by the specific heat of LiOH i.e. the amount of calories absorbed by 1 mole of LiOH to change 1 degree Celsius. Consequently, one can theoretically calculate the Phase A heat absorption by using LiOH's specific heat of 11.87 cal/deg mol or 11.87/23.9484(g/mol)=0.4956 cal/deg g (see *CRC, HANDBOOK OF CHEMISTRY & PHYSICS, 63rd EDITION*, P. D-74 (1982–1983)) as follows:(462° C.−25° C.)×0.4956 cal/deg g=217 cal/g. Thus, A=217 cal/g.

When the temperature of LiOH reaches its melting point i.e. 462° C., LiOH begins to melt. This begins Phase B. While the melting is going on and until LiOH is completely liquid there is no change in temperature (ergo the flat line at Phase B). The amount of heat in calories absorbed during such phase B at 462° C. is 103.3 cal/g. see *CRC, HANDBOOK OF CHEMISTRY & PHYSICS 63RD EDITION*, P. B-252 (1982–1983).

Once LiOH has completely melted, its temperature begins to rise. This begins phase C in FIG. 1. Just as in phase A, the amount of heat absorbed during phase C is limited only by LiOH's specific heat of 0.4956 cal/deg g. Thus, one can theoretically calculate the Phase C heat absorption as follows: (1100° C.−462° C.)×0.4956 cal/deg g 316 cal/g i.e. C=316 cal/g.

When the temperature of the melted LiOH reaches its temperature of decomposition, approximately 1100° C. LiOH begins to decompose, i.e.,

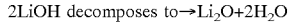

$$2LiOH \text{ decomposes to} \rightarrow Li_2O + 2H_2O$$

This begins phase D. While the decomposition is going on and until LiOH is completely decomposed there is practically no change in temperature (ergo the flat line at Phase D). The amount of heat in calories absorbed during such phase D at approximately 1100° C. is approximately 600 cal/g.

Therefore, based on the discussion above, the theoretical amount of heat absorbed by LiOH when used as an endotherm, is:

$$217 \text{ cal/g} + 103.3 \text{ cal/g} + 316 \text{ cal/g} + 600 \text{ cal/g} = 1236.3 \text{ cal/g}.$$

It is seen from the foregoing that when LiOH decomposes at its specified temperature of reaction to form Lithium Oxide, it absorbs a large quantity of latent heat of reaction. More importantly, however, a higher amount of latent heat is absorbed by the melting of LiOH and its heat capacity up to 1000° C. The above suggests that LiOH should be very good at absorbing 686 cal/g for the decomposition, an extra 316 cal/g for its heat capacity up to 1100° C., 103.3 cal/g for its melting at 462° C. and 217 cal/g for its heat capacity to 462° C.

In fact, when LiOH was actually used as an endotherm in the heat absorbing device of the present invention it was determined that it actually absorbed 1207 cal/g.

Figure 2:
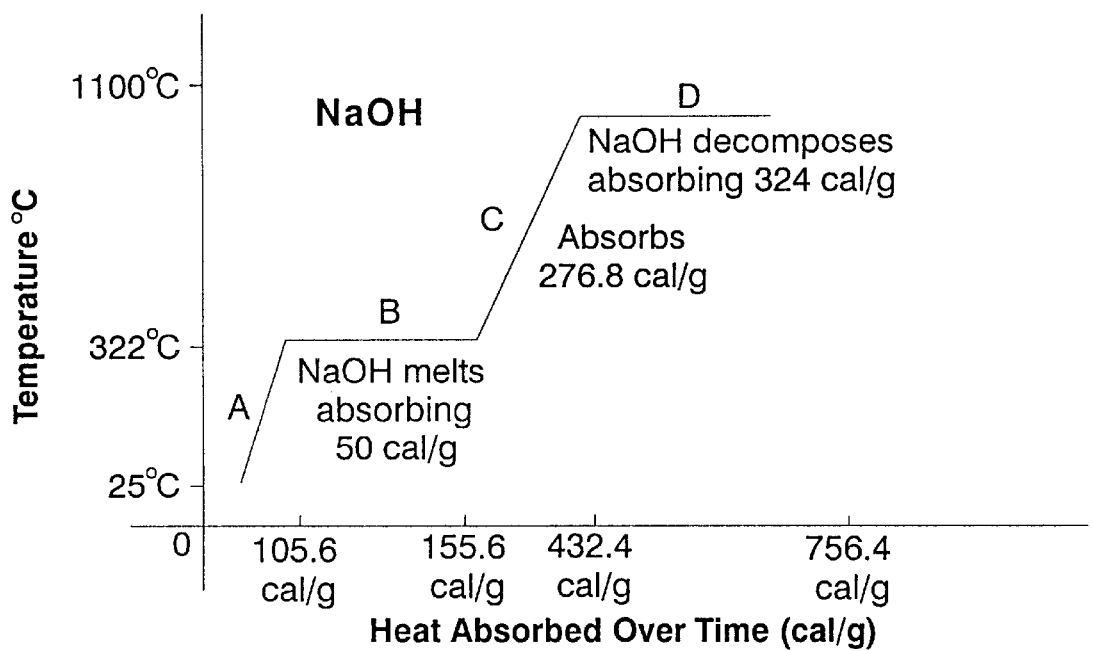
FIG. 2 is an illustrative schematic graph of the four phases of the heat absorption exhibited by Sodium Hydroxide and the phenomena observed during such phases, when Sodium Hydroxide is used as an endotherm, in accordance with the present invention.

(b) SODIUM HYDROXIDE: Sodium Hydroxide's use as an endotherm at temperatures below and up to 1100° C. is similarly characterized by at least four phases of heat absorption. FIG. 2 shows these four phases of heat absorption, i.e. A, B, C and D, and the phenomena observed during such phases. It is noted that the slopes of the graph are neither accurate nor precise but are only intended to be illustrative in nature.

Theoretically, the total amount of heat in calories absorbed by NaOH when exposed to temperatures below and up to 1100° C. can be mathematically represented by the following formula:

$$A+B+C+D=Hrx$$

where
- A=the amount of heat in calories absorbed by NaOH prior to melting;
- B=the amount of heat in calories absorbed during actual melting phase of NaOH;
- C=the amount of heat in calories absorbed by NaOH once melting is complete and it begins approaching its temperature of decomposition; and D=the actual amount of heat of decomposition of NaOH in calories.

(i) Calculating Hrx for NaOH:

The amount of heat in calories absorbed during Phase A (FIG. 2) as NaOH's temperature begins to rise from room temperature i.e. 25° C. to its Melting Point temperature of 322° C. see CRC, HANDBOOK OF CHEMISTRY & PHYSICS, 63RD EDITION, P. B-253 (1982–1983) is limited only by the specific heat of NaOH, when NaOH is a solid i.e. the amount of calories absorbed by 1 mole of NaOH to change 1 degree Celsius. Consequently, one can theoretically calculate the Phase A heat absorption by using NaOH's specific heat of 14.23 cal/deg mol or 14.23/39.9972(g/mol)= 0.3558 cal/deg g see CRC, HANDBOOK OF CHEMISTRY & PHYSICS, 63rd EDITION, P. D-86 (1982–1983) as follows:(322° C.−25° C.)×0.3558 cal/deg g=105.6 cal/g. Thus, A=105.6 cal/g.

When the temperature of NaOH reaches its melting point i.e. 322° C., NaOH begins to melt. This begins Phase B (FIG. 2). While the melting is going on and until NaOH is completely liquid there is no change in temperature (ergo the flat line at Phase B). The amount of heat in calories absorbed during such phase B at 322° C. is 50.0 cal/g. see CRC, HANDBOOK OF CHEMISTRY & PHYSICS 63RD EDITION, P. B-253 (1982–1983).

Once NaOH has completely melted, its temperature begins to rise. This begins phase C (FIG. 2). Just as in phase A, the amount of heat absorbed during phase C is limited only by NaOH's specific heat of 0.3558 cal/deg g. Thus, one can theoretically calculate the Phase C heat absorption as follows: (1100° C.−322° C.)×0.3558 cal/deg g=276.8 cal/g i.e. C=276.8 cal/g.

When the temperature of the melted NaOH reaches its temperature of decomposition, approximately 1100° C. NaOH begins to decompose, i.e.,

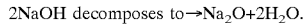

2NaOH decomposes to→$Na_2O+2H_2O$.

This begins phase D (FIG. 2). While the decomposition is going on and until NaOH is completely decomposed there is practically no change in temperature (ergo the flat line at Phase D). The amount of heat in calories absorbed during such phase D at approximately 1100° C. is approximately 324 cal/g.

Therefore, based on the discussion above, the theoretical amount of heat absorbed by NaOH when used as an endotherm, is:

105.6 cal/g+50 cal/g+276.8 cal/g+324 cal/g=756.4 cal/g.

It is seen from the foregoing that when NaOH decomposes at its specified temperature of reaction to form Sodium Oxide, it absorbs a large quantity of latent heat of reaction. More importantly, however, a higher amount of latent heat is absorbed by the melting of NaOH and its heat capacity up to 1000° C. The above suggests that NaOH should be very good at absorbing 324 cal/g for the decomposition, an extra 276.8 cal/g for its heat capacity up to 1100° C., 50.0 cal/g for its melting at 322° C. and 105.6 cal/g for its heat capacity to 322° C.

In fact, when NaOH was actually used as an endotherm in the heat absorbing device, it was determined that it actually absorbed 585 cal/g.

Figure 3:
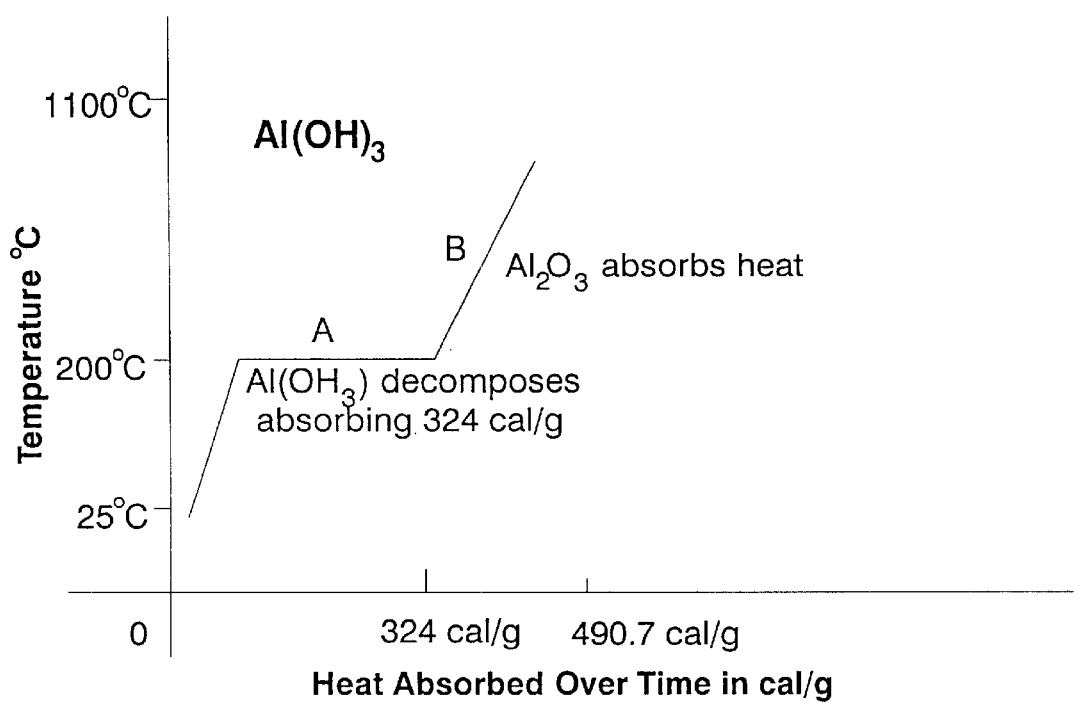
FIG. 3 is an illustrative schematic graph of at least two phases of the heat absorption exhibited by Aluminum Hydroxide and the phenomena observed during such phases, when Aluminum Hydroxide is used as an endotherm, in accordance with the present invention.

(C) ALUMINUM HYDROXIDE: Aluminum Hydroxide's use as an endotherm at temperatures below and up to 1100° C., on the other hand, is characterized by at least two phases of heat absorption. FIG. 3. shows these two phases of heat absorption, i.e. A and B, and the phenomena observed during such phases. It is noted that the slopes of the graph are neither accurate nor precise but are only intended to be illustrative in nature.

Theoretically, the total amount of heat in calories absorbed by $AM(OH)_3$ when exposed to temperatures below and up to 1100° C. can be mathematically represented by the following formula:

$$A+B=Hrx$$

where

A=the amount of heat in calories absorbed by $Al(OH)_3$ prior to decomposing; and B=the amount of heat in calories absorbed by $Al_2O_3$ once the decomposition is complete.

(i) Calculating Hrx for $Al(OH)_3$

The amount of heat in calories absorbed during Phase A (FIG. 3) as $Al(OH)_3$'s temperature begins to rise from room temperature i.e. 25° C. to its temperature of Decomposition of approximately 200° C. has been found to be approximately 324 cal/g. Aluminum Hydroxide decomposes as follows:

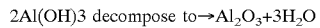

2Al(OH)3 decompose to→$Al_2O_3+3H_2O$

While the decomposition is going on and until $Al(OH)_3$ is completely decomposed there is practically no change in temperature (ergo the flat line at phase A). The amount of heat in calories absorbed during such phase A is A=324 cal/g.

Figure 8:
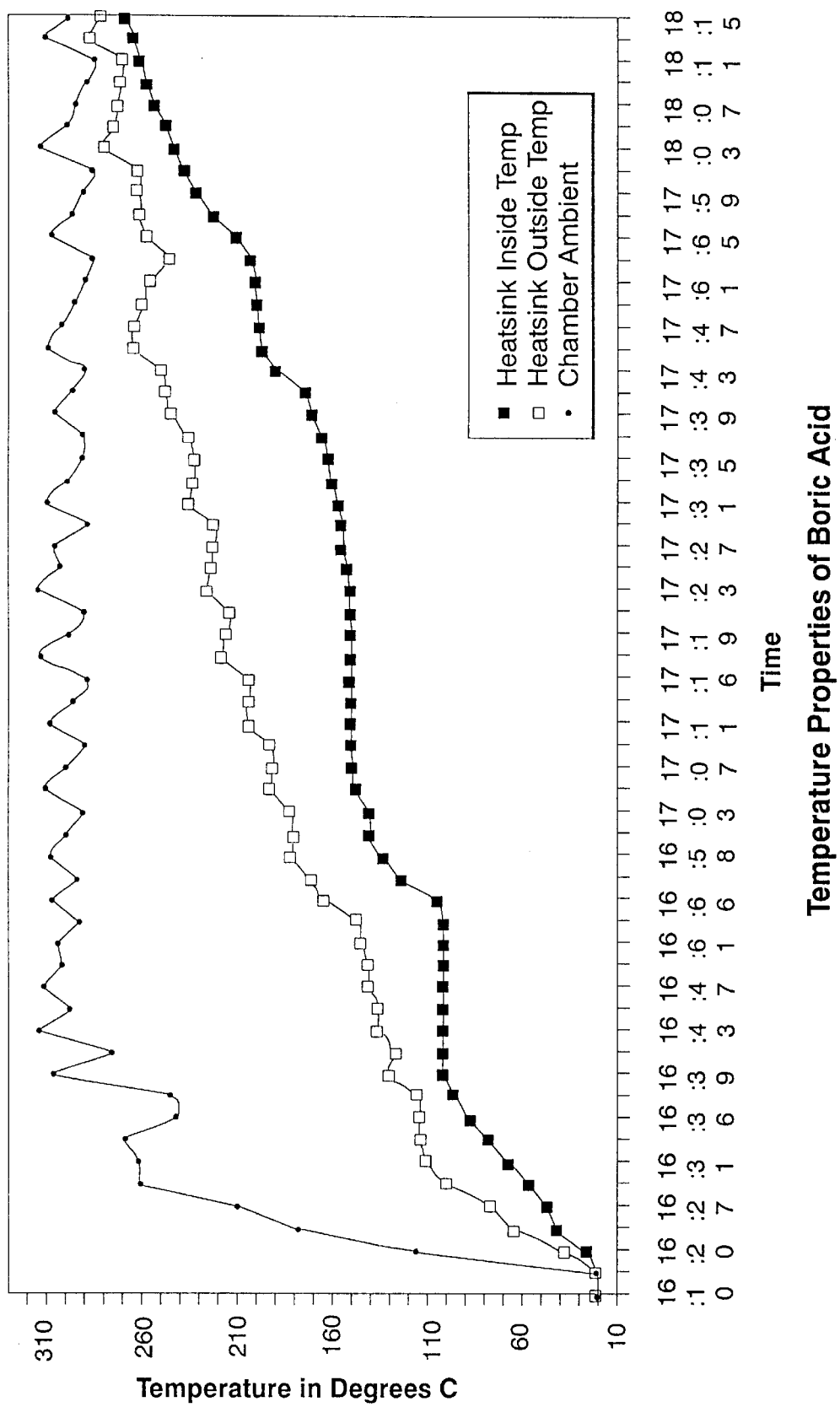
Figure 9:
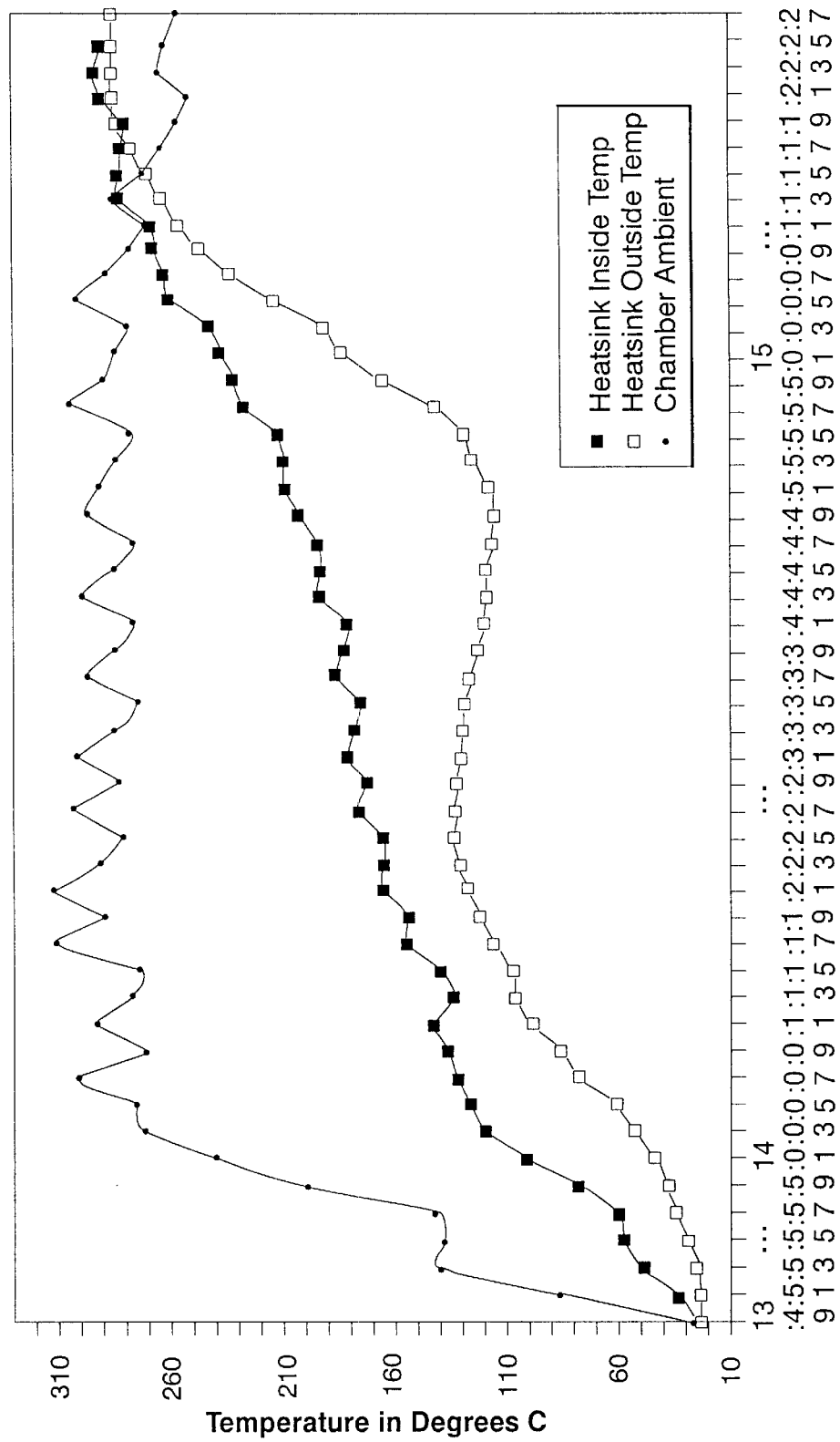
FIG. 9 is a graph showing the use of a hydrated salt, i.e., Magnesium Sulfate Heptahydrate, in accordance with the present invention.

Once $Al(OH)_3$ is completely decomposed to $Al_2O_3$, $Al_2O_3$'s temperature begins to rise. This begins phase B in FIG. 8. The amount of heat absorbed during phase B is limited only by $Al_2O_3$'s specific heat of 0.1853 cal/deg g. see CRC, HANDBOOK OF CHEMISTRY & PHYSICS 63RD EDITION, P. D-53 (1982–1983).

Thus, one can theoretically calculate the Phase B heat absorption as follows:

(1110° C.−200° C.)×0.1853 cal/deg g=166.77 cal/g i.e. B=166.77 cal/g.

Therefore, based on the discussion above, the theoretical amount of heat absorbed by $Al(OH)_3$ when used as an endotherm, is:

324 cal/g+166.77 cal/g=490.77 cal/g.

It is seen from the foregoing that when $Al(OH)_3$ decomposes at its specified temperature of reaction to form Aluminum Oxide, it absorbs a large quantity of latent heat of reaction. More importantly, however, a higher amount of specific heat is absorbed due to the heat capacity of $Al_2O_3$ up to 1100° C. The above suggests that $Al(OH)_3$ should be very good at absorbing 324 cal/g for the decomposition, and an extra 166.77 cal/g for $Al_2O_3$'s heat capacity up to 1100° C.

In fact, when $Al(OH)_3$ was actually used as an endotherm in a heat sink it was determined that it actually absorbed 510 cal/g.

II. The following illustrates the endothermic reaction and heat absorption of the aforementioned carbonate salts, when they are subjected to a temperature of reaction below 1100° C.

Figure 4:
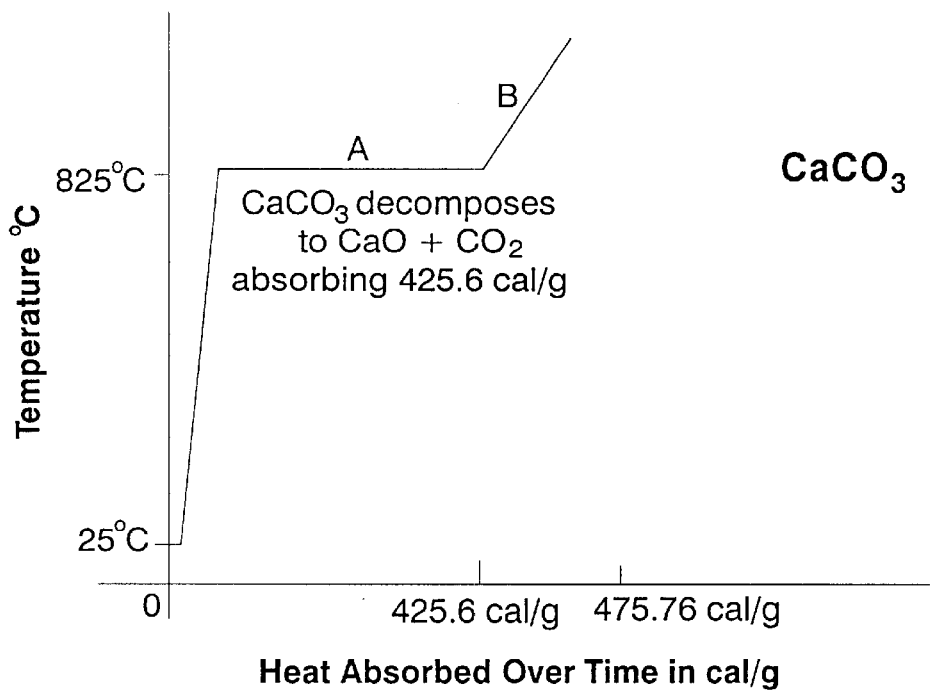
FIG. 4 is an illustrative schematic graph of at least two phases of the heat absorption exhibited by Calcium Carbonate and the phenomena observed during such phases, when Calcium Carbonate is used as an endotherm, in accordance with the present invention.
Figure 5:
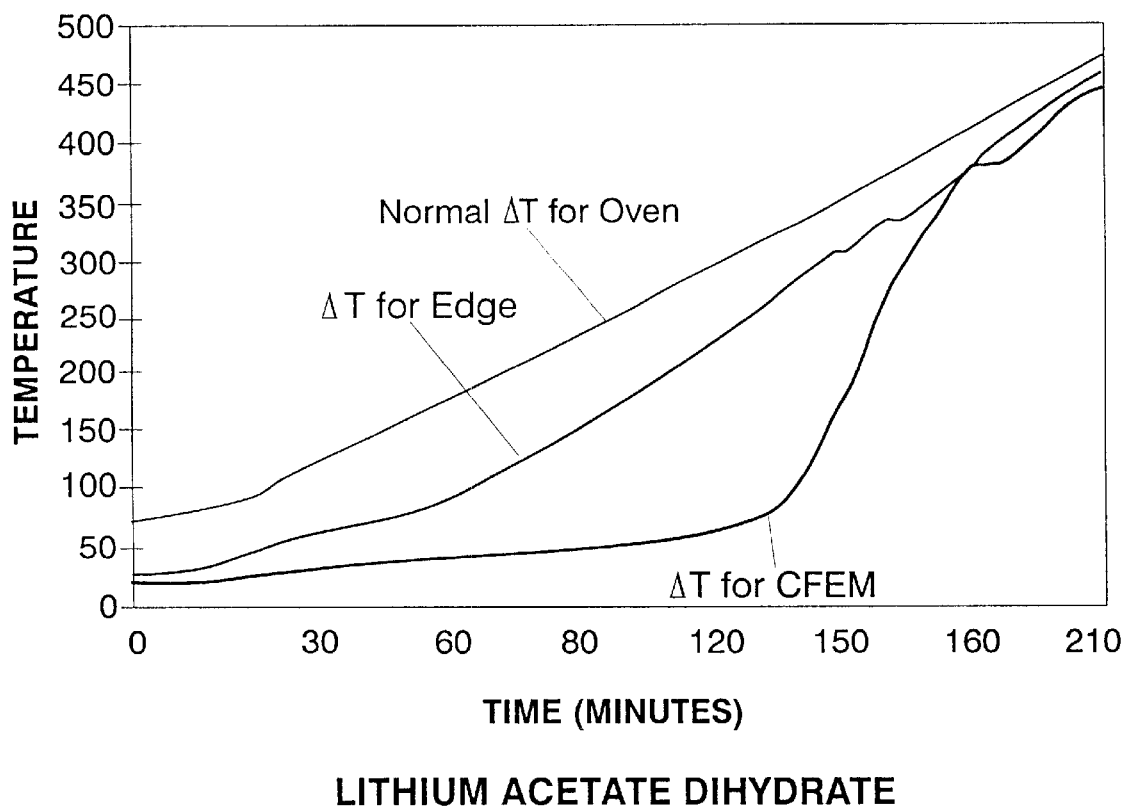
FIG. 5 and FIG. 6 are graphs showing the natural delay in temperature rise for Lithium Formate and Lithium Acetate thermal decomposition reactions.
Figure 6:
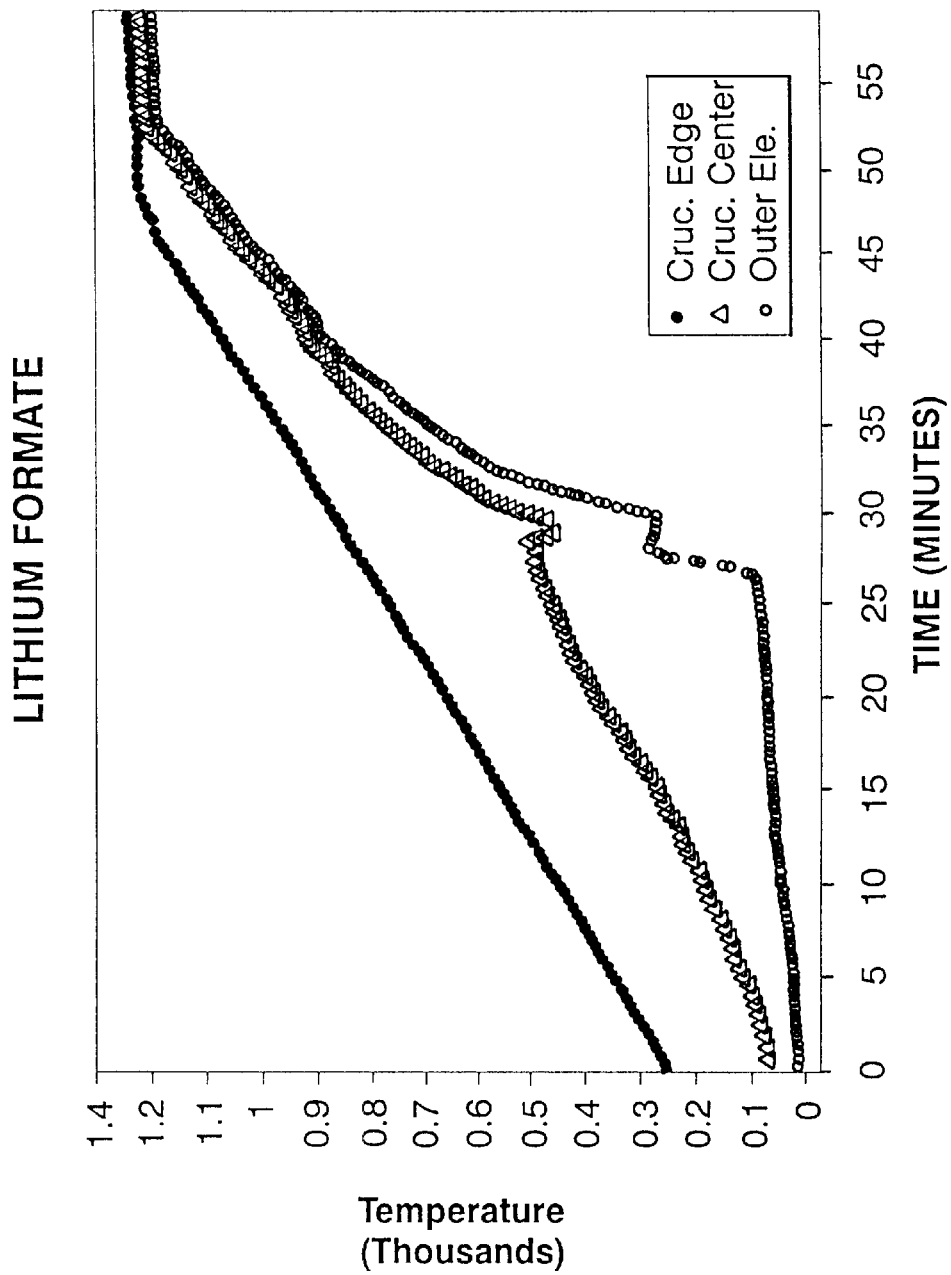
Figure 7:
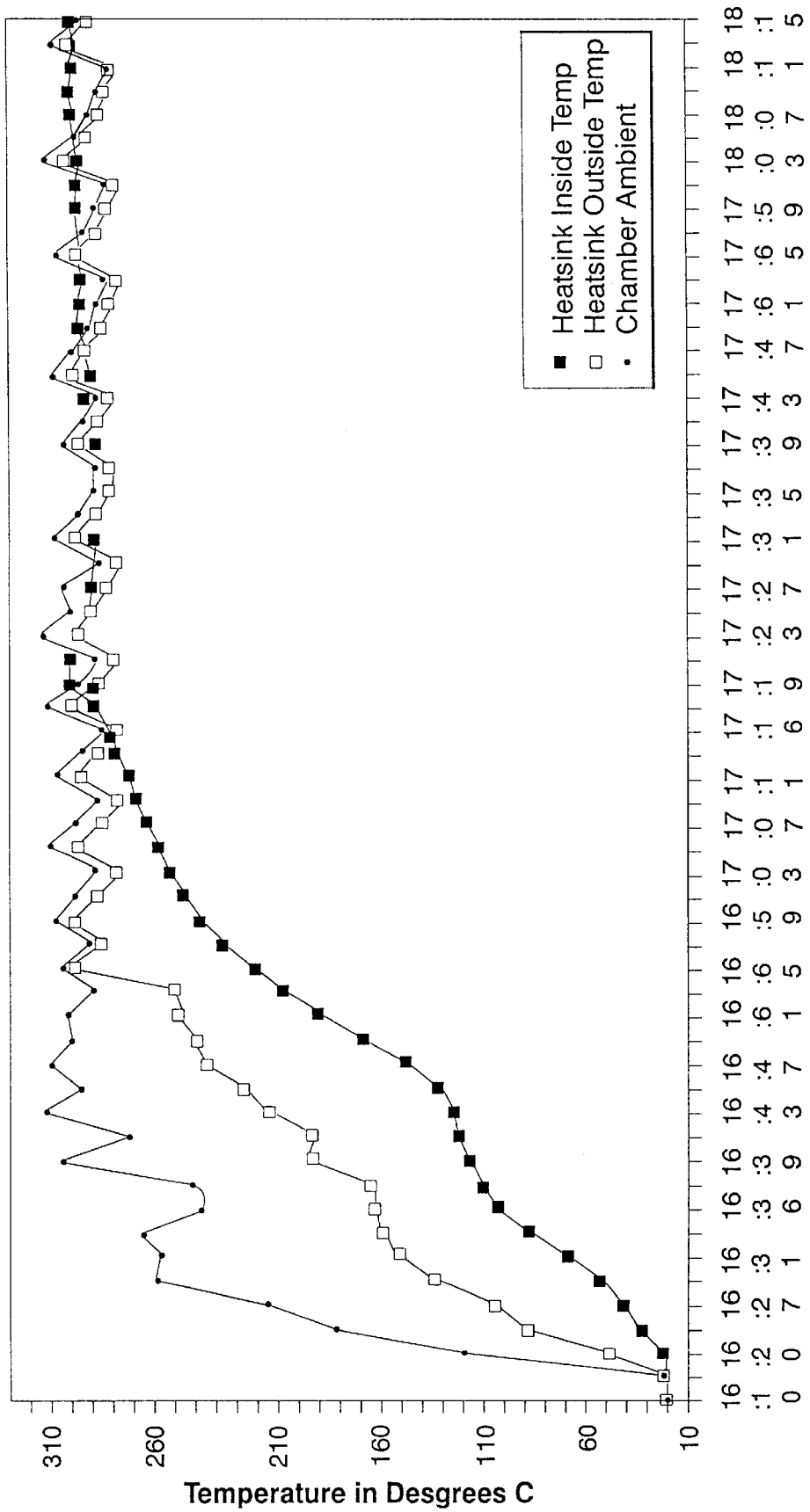
FIG. 7 and FIG. 8 are graphs showing the natural rise in temperature of conventional beryllium or wax heat sink when used with a flight data recorder, as compared to the same flight date recorder's thermal performance with a boric acid heat absorbing shield formed in accordance with the present invention.

(a) CALCIUM CARBONATE: Calcium Carbonate's use as an endotherm at temperatures below and up to 1100° C., is characterized by at least two phases of heat absorption. FIG. 4 shows these two phases of heat absorption, i.e. A and B, and the phenomena observed during such phases. It is noted that the slopes of the graph are neither accurate nor precise but are only intended to be illustrative in nature.

Theoretically, the total amount of heat in calories absorbed by Calcium Carbonate when exposed to temperatures below and up to 1100 0° C. can be mathematically represented by the following formula:

$$A+B=Hrx$$

where
- A=the amount of heat in calories absorbed by $CaCO_3$ at its temperature of decomposition;
- B=the amount of heat in calories absorbed by CaO as its temperature rises.
  - (i) Calculating Hrx for $CaCO_3$ The amount of heat in calories absorbed during Phase A (FIG. 4) by $CaCO_3$ at the temperature of Decomposition of approximately 825° C. has been found to be approximately 425.6 cal/g. see *MERCK INDEX, TENTH EDITION*, P. 228 (1983). Calcium Carbonate decomposes as follows:

$$CaCO_3 \text{ decomposes to} \rightarrow CaO+CO_2$$

While the decomposition is going on and until $CaCO_3$ is completely decomposed there is practically no change in temperature (ergo the flat line at phase A). Thus, A=425.6 cal/g. It is noted that in the present theoretical calculations the amount of heat absorbed by $CaCO_3$ as its temperature begins to rise from room temperature i.e. 25° C. to its actual temperature of decomposition has been omitted, for simplicity's purposes.

Once $CaCO_3$ is completely decomposed to CaO, now CaO's temperature begins to rise. This begins phase B in FIG. 4. The amount of heat absorbed during phase B is limited only by CaO's specific heat of(19.57 cal/deg mol)/(100.089 gr./mol)=0.1824 cal/deg g. see *CRC, HANDBOOK OF CHEMISTRY & PHYSICS 63RD EDITION*, P. D-59 (1982–1983).

Thus, one can theoretically calculate the Phase B heat absorption as follows:

$$(1100° C.-825° C.)\times 0.1824 \text{ cal/deg g}=50.16 \text{ cal/g i.e. } B=50.16 \text{ cal/g.}$$

Therefore, based on the discussion above, the theoretical amount of heat absorbed by $CaCO_3$ when used as an endotherm, is:

$$425.6 \text{ cal/g}+50.16 \text{ cal/g}=475.76 \text{ cal/g.}$$

It is seen from the foregoing that when $CaCO_3$ decomposes at its specified temperature of reaction to form Calcium Oxide, it absorbs a large quantity of latent heat of reaction. More importantly, however, a higher amount of latent heat is absorbed by the heat capacity of CaO up to 1100° C. The above suggests that $CaCO_3$ should be very good at absorbing 425.6 cal/g for the decomposition, and an extra 50.16 cal/g for CaO's heat capacity up to 1100° C.

In fact, when $CaCO_3$ was actually used as an endotherm in a heat absorbing device (heat shield) it was determined that it actually absorbed 725.60 cal/g. This amount of heat is significantly higher than the amount of heat theoretically calculated above. This is logical when one considers that (i) the theoretical calculations above did not take into consideration the heat absorbed by $CaCO_3$, during the time that its temperature was rising from room temperature up to its temperature of decomposition (specific heat); and (ii) more likely than not, the $CaCO_3$ was probably contaminated with small amounts of water, which has its heat of vaporization; thereby adding to the total endothermic effect observed during the testing of $CaCO_3$.

(b) SILICON CARBONATE ($SiCO_3$): On the basis of the discussion set forth above in connection with $CaCO_3$, it was theorized that Silicon Carbonate should exhibit the same type of endothermic absorption effects. In fact, when Silicon Carbonate was used as an endothermic material it was found that:

$$(SiCO_3) \text{ decomposes to} \rightarrow SiO+CO_3 \text{ at } 1100° C.,$$

and that it absorbs 380 cal/gm for decomposition.

(c) MAGNESIUM CARBONATE ($MgCO_3$): Similarly, when Magnesium Carbonate was used as endothermic material it was found that the starting endothermic material is composed of Magnesium Carbonate ($MgCO_3$), Magnesium Hydroxide ($Mg(OH)_2$) and Water ($H_2O$). i.e., n $MgCO_3$:n $Mg(OH)$:n $H_2O$; and that n $MgCO_3$:n $Mg(OH)_2$:n $H_2O$ decomposes to→nMgO+ $nCO_2$ and $nH_2O$ at 700° C. The amount of heat absorbed during such decomposition was 285 cal/gm.

III. Other reactions which can provide endothermic cooling of heat sensitive devices, other surfaces and structures via heat absorption i.e. endothermic mechanisms similar to those described above are as follows:

(a) SODIUM BICARBONATE: The Thermal Decomposition of sodium bicarbonate absorbs in excess of 350 cal/gm between 120° C. and 310° C. i.e.

$$2NaHCO_3 \rightarrow Na_2CO_3+H_2O+CO_2$$

T=270° C.

$\Delta H_r$=363 cal/g (b) SODIUM BICARBONATE: The Thermal Decomposition of sodium bicarbonate absorbs in excess of 320 cal/gm between 200° C. and 375° C. i.e.

MW=84.0

$2NaHCO_3 \rightarrow Na_2CO_3+H_2O+CO_2$ $\Delta H°$=30.45 Kcal/mol $\Delta H_f°$: −226.5 −102 −94.05

$\Delta H_r$=(30,450 cal/mol)/(84 g/mol)=363 cal/g (c) BORIC ACID: In particular, it has been found that boric acid absorbs large amounts of heat when decomposing, because boric acid decomposes in stages over a range of temperatures to produce boron oxide and water while absorbing nearly 400 cal/g. Borate salts act similarly for effective heat absorption results.

Specifically, the Thermal Decomposition of Boric Acid absorbs in excess of 400 cal/gm between 120° C. and 350° C. i.e.

MW=62

$$2H_3BO_3 \xrightarrow{169° C.} (2HBO_2 + 2H_2O) \xrightarrow{300° C.} B_2O_3 + 3H_2O$$

$\Delta H_f$: −260 mp=236° C. −302 −57.8 Kcal/mol $\Delta H$=53.6 Kcal/2 mol $H_3BO_3$ $\Delta H_r$=(53,600 Kcal/2 mol)(2(62) g/2 mol≧432 cal/g IV. The following illustrate the endothermic reaction and heat absorption of hydrated salts for the cooling of heat sensitive devices, other surfaces and structures via heat absorption mechanisms similar to those described above when subjected to a temperature reaction below 1100° C. Specifically the following hydrate salts provide effective endothermic cooling from 60° C. through 200° C.:

(a) HYDRATED SALT OF LITHIUM CHLORIDE: This reaction will provide endothermic cooling of electronic devices and other surfaces and structures by the thermal decomposition of lithium chloride trihydrate absorbing in excess of 440 cal/g between 90° C. and 1500° C. i.e.

$$LiCl.3H_2O \rightarrow LiCl+3H_2O \text{ at } 98° C.$$

$\Delta H_f°$: (−313.5) (−97) (−173) Kcal $\Delta H_r$=42.4 Kcal/mol

MW=96.39

(42.4 Kcal/mole)/96.39=440 cal/g (b) HYDRATED SALT OF MAGNESIUM CHLORIDE:

$$MgCl_2.6H_2O \rightarrow MgCl_2+6H_2O$$

$\Delta H_f°$: (−454) (−266) (−346.8)

$\Delta H_r$ is negative.

(c) HYDRATED SALT OF MAGNESIUM SULFATE: This reaction will provide endothermic cooling of heat sensitive devices and other surfaces and structures by the thermal decomposition of magnesium sulfate heptahydrate absorbing in excess of 350 cal/g between 120° C. and 250° C. i.e.

$$MgSO_4.7H_2O \rightarrow MgSO_4+7H_2O$$

$\Delta H_r°$: (−808.7) (−305.5) (−404.6)

$\Delta H_r$=98.6 Kcal/mol

MW=246.37

(98.6 Kcal/mole)/246.37=400.2 cal/g (d) HYDRATED SALT OF SODIUM SULFATE:

$$Na_2SO_4.10H_2O \rightarrow Na_2SO_4+10H_2O$$

$\Delta H_f°$: (−1033.48) (−330.9) (−578)

$\Delta H_r$=124.58 Kcal/mol

MW=354.12

(124.58 Kcal/mole)/354.12=351.8 cal/g (e) HYDRATED SALT OF ALUMINUM OXIDE:

$$Al_2O_3.3H_2O \rightarrow Al_2O_3+3H_2O$$

$\Delta H_f°$: (−613.7) (−384.84) (−173.4)

$\Delta H_r$=55.46 Kcal/mol

MW=155.96

(55.46 Kcal/mole)/155.96=355.6 cal/g (f) HYDRATED SALT OF ALUMINUM SULFATE:

$$Al_2(SO_4)_3.18H_2O \rightarrow Al_2(SO_4)_3+18H_2O$$

$\Delta H_f°$: (−2118.5) (−820.98) (−1040.4)

$\Delta H_r$=257.12 Kcal/mol

MW=666.14

(257.12 Kcal/mole)/666.14=385.98 cal/g (g) HYDRATED SALT OF ALUMINUM FLUORIDE:

$$AlF_3.3H_2O \rightarrow AlF_3+3H_2O$$

$\Delta H_f°$: (−349.1) (−311) (−173.4)

$\Delta H_r$=64.7 Kcal/mol

MW=137.98

(64.7 Kcal/mole)/137.98=468.9 cal/g (h) HYDRATED SALT OF ALUMINUM NITRATE:

$$Al_2(NO_3)_3.9H_2O \rightarrow Al_2(NO_3)_3+9H_2O$$

$\Delta H_f°$: (−897.34) (−273.65) (−520.2)

$\Delta H_r$=103.49 Kcal/mol

MW=375.01

(103.49 Kcal/mole)/375.01=275.98 cal/g

An additional endothermic effect may be obtained by the further decomposition of $Al_2(NO_3)_3$.

(i) HYDRATED SALT OF LITHIUM NITRATE: This reaction will provide endothermic cooling of heat sensitive devices and other surfaces and structures by the thermal decomposition of lithium nitrate trihydrate absorbing in excess of 320 cal/g between 50° C. and 120° C. i.e.

$$LiNO_3.3H_2O \rightarrow LiNO_3+3H_2O \text{ at } 61° C.$$

$\Delta H_f°$: (−328.6) (−115.3) (−57.8)

$\Delta H_r$=39.9 Kcal/mol

MW=123

(39.9 Kcal/mole)/123=324.4 cal/g (j) HYDRATED SALT OF SODIUM CARBONATE: This reaction will provide endothermic cooling of heat sensitive devices and other surfaces and structures by the thermal decomposition of sodium carbonate decahydrate absorbing in excess of 320 cal/g between 20° C. and 80° C. i.e.

$$Na_2CO_3.10H_2O \rightarrow Na_2CO_3+10H_2O; \text{ loses } H_2O \text{ at } 34° C.$$

$\Delta H_f°$: (−975.6) (−270) (−57.8)

$\Delta H_r$=127.6 Kcal/mol

MW=266

(127.6 Kcal/mole)/266=480 cal/g (k) HYDRATED SALT OF SODIUM BORATE: This reaction will provide endothermic cooling of heat sensitive devices and other surfaces and structures by the thermal decomposition of sodium borate decahydrate absorbing in excess of 350 cal/g between 200° C. and 375° C. i.e.

$$Na_2B_4O_7.10H_2O \rightarrow Na_2B_4O_7+10H_2O; \text{ at } 320° C.$$

$\Delta H_f°$: (−1497) (−777.7) (−578)

$\Delta H_r$=141.3 Kcal/mol

MW=382

(141.3 Kcal/mole)/382=370 cal/g (l) HYDRATED SALT OF BERYLLIUM SULFATE: This reaction will provide endothermic cooling of heat sensitive devices and other surfaces and structures by the thermal decomposition of beryllium sulfate quatrohydrate absorbing in excess of 300 cal/g between 90° C. and 450° C. i.e.

$BeSO_4.4H_2O \rightarrow BeSO_4.2H_2O + 2H_2O$; at 100° C.

$\Delta H_f^\circ$: (−576.3) (−433.2) (−57.8)

$BeSO_4.2H_2O \rightarrow BeSO_4 + 2H_2O$; $\Delta H^\circ = 31.6$ (−433.2) (−286) (−57.8) $\Delta H^\circ = 31.6$ $\Delta H_r = 65.53$ Kcal/mol

MW=177.1

(65.53 Kcal/mole)/177.1=370 cal/g (m) HYDRATED SALT OF SODIUM PHOSPHATE: This reaction will provide endothermic cooling of heat sensitive devices and other surfaces and structures by the thermal decomposition of sodium phosphate dodecahydrate absorbing in excess of 300 cal/g between 80° C. and 150° C. i.e.

$Na_3PO_4.12H_2) \rightarrow Na_3PO_4 + 12H_2O$ $\Delta H_f^\circ$: (−1309) (−460) (−57.8)

$\Delta H_r = 156.4$ Kcal/mol

MW=377

(156.4 Kcal/mole)/377=412 cal/g (n) HYDRATED SALT OF CALCIUM CHLORIDE: This reaction will provide endothermic cooling of heat sensitive devices and other surfaces and structures by the thermal decomposition of calcium chloride hexahydrate absorbing in excess of 300 cal/g between 220° C. and 350° C. i.e.

$CaCl_2.6H_2O \rightarrow CaCl_2 + 6H_2O$ at 200° C.

$\Delta H_f^\circ$: (−623.2) (−190) (−57.8)

$\Delta H_r = 86.4$ Kcal/mol

MW=219

(86.4 Kcal/mole)/219=395 cal/g (o) HYDRATED SALT OF ZINC SULFATE: This reaction will provide endothermic cooling of heat sensitive devices and other surfaces and structures by the thermal decomposition of zinc sulfate heptahydrate absorbing in excess of 300 cal/g between 220° C. and 350° C. i.e.

$ZnSO_4.7H_2O \rightarrow ZnSO_4 + 7H_2O$; at 280° C.

$\Delta H_f^\circ$: (−735.1) (−233.8) (−57.8)

$\Delta H_r = 96.7$ Kcal/mol

MW=288

(96.7 Kcal/mole)/288=336 cal/g

IV. Other endothermic reactions that have been found suitable for use in the present inventive heat absorbing devices on the basis of the principles set forth above, are the decomposition of paraldehyde, paraformaldehyde and trioxane which, likewise, result in relatively large scale endothermies.

Several of the reaction products of the combination of the aforementioned materials such as lithium acetate, lithium formate and their hydrates may also be used. The graphs 5 and 6 show the natural delay in temperature rise for lithium formate and lithium acetate thermal decomposition reactions.

It has also been found that the salts of acetic acid and formic acid and their hydrates result in large scale endothermic reactions and absorptions of large quantities of heat. Accordingly, these formic and acetic acid salts are also suitable for use in the present inventive heat absorbing devices.

IV. The compounds of the present invention may be supported within the inventive heat absorbing device via composite fabric carriers or matrices of the type discussed in Applicant's aforementioned application and in the prior noted patents, to form an endothermic structure. Additionally, the compounds can be supported up against the heat sensitive device as an endothermic structure via a retaining matrix, packaging, encapsulation, microencapsulation, enclosure, or structure; or by being suspended in other media; or they themselves may be used in bulk to form the endothermic structure. Irrespective of the support or whether they themselves form the endothermic structure, said endothermic structure can be measured, cut and fit to form (i) a heat absorbing surface up against the heat sensitive device; (ii) an enclosure or container, within which the heat sensitive device can be placed; or (iii) a thermal barrier structure or shield between a heat generator and the heat sensitive device. If the compounds have not been formed into an endothermic structure, supported or otherwise, they could be simply deposited around the heat sensitive device. Another embodiment, the retaining structure can be made of a low thermal conductivity material (or a thermal insulator) such as a plastic or polyamide.

Thus, in one embodiment of a heat absorbing device designed to protect a heat sensitive device from external heat, the endothermic compounds are enclosed within the walls of an enclosure. As used herein the term enclosure includes containers or box-like structures of any size or shape. In another embodiment of a similar heat absorbing device, the compounds line the inner surface of the walls of the enclosure. In a third embodiment of said heat absorbing device, the endothermic compounds line the outer surface of the walls of the enclosure. In yet another embodiment of said device, the endothermic compounds are packed around the heat sensitive device, surrounded with a retaining structure so that it stays packed around the heat sensitive device, and the wrapped device is then placed in the enclosure. The retaining structure can, if desired, be a thermally conductive structure.

On the other hand, in an embodiment of a heat sensitive device designed to protect a heat sensitive device from its own self-generated internal heat, the endothermic compounds are poured into a container or supported by a structure and the heat sensitive device is embedded therein. Of course, if the heat sensitive device is embedded within the endothermic compound, it is imperative to choose an endothermic compound whose temperature of reaction is suitable for the particular application, and whose decomposition and/or dehydration products will not affect the heat sensitive devices.

It is clear from the above that the position or location of the endothermic compounds is not fixed relative to the heat sensitive device, any outer structure supportive or its insulation. Rather such position or location is dependent on the application and the heat sensitive device's design specifications and heat tolerance. Similarly, the enclosure's shape is not limited. In fact, the shape and dimensions thereof may or may not be limited by the application and the heat sensitive device's design specifications.

When the heat absorbing device comprises endothermic compounds within or lining its walls (either outer or inner), as is in the case of a heat absorbing device designed to protect from external heat (see discussion above), the heat sensitive device can be placed within the enclosure either snugly, with no space between it and the walls of said enclosure; or loosely so that there is a defined space or a gap between it and the enclosure's walls.

If the heat sensitive device is placed so that it fits snugly within the enclosure, then the enclosure will be sealed to protect the heat sensitive device from the external high heat conditions, and the entire package can be further wrapped in insulation to further protect the heat sensitive device from the outside high temperatures.

On the other hand, if the heat sensitive device is placed so that it fits to form a gap between it and the heat absorbing enclosure, a layer of insulation can be placed in the gap between the heat sensitive device and the enclosure's walls. This adds another layer of protection against the outside heat. The enclosure is then sealed and if desired can be further wrapped in another layer of insulation to further protect the heat sensitive device from the outside high heat.

In a preferred embodiment, however, of the heat absorbing device designed to protect from external heat, said device is placed adjacent tot he heat sensitive device; thereafter insulation is wrapped or surrounded about the device and heat absorber and the entire package may be placed in a housing.

In one application using the present invention, a flight data recorder is provided with a heat absorbing shield. The shield is in essence a single, flat, rectangular block very similar to a small brick. It is sized in length, height and width so that it could lie right up against and contact the surface of the flight data recorder circuit board, which requires protection. The shield consists of cakes of boric acid held together and retained with metal or plastic. The boric acid wafers are formed by compression into rectangular cakes, which fit neatly into the shield's metal or plastic retainer.

The boric acid shield is then laid up against the circuit board of the memory control system of the flight data recorder. The accompanying graphs 7 and 8 show the natural rise in temperature of a conventional beryllium or wax heat sink when used with the flight data recorder, as compared to the same flight recorder's thermal performance with a boric acid heat absorbing shield formed in accordance with the present invention described above.

In other applications of the invention, the flight recorder is placed within boric acid box-like structures; each differing only in the location of the boric acid, as described above. The structures are then sealed to protect the flight data recorder from the external high heat conditions and subjected to thermal loads in excess of fifty thousand watts per one hour (1 watt=3600 joules; 1 cal=4,1850 joules), which is the present government standard for testing flight recorders.

Again it was found that the flight recorder's thermal performance after it was sealed within any of the boric acid structures taught above, was substantially better than the thermal performance of the same flight recorder applying a conventional beryllium or wax heat sink thermally protective structure.

Graph 9 shows the use of a hydrated salt i.e. $MgSO_4 \cdot 7H_2O$ in accordance with the teachings set forth above, and how such use resulted in a strong cooling effect as applied to the flight recorder of Graph 7.

V. The ultimate shape, size and physical characteristics of the heat absorbing device, as well as the type and amount of endothermic material used, are dictated by many factors. These factors include the type of heat sensitive device being protected; the time period for which the heat sensitive device will be exposed to high heat; the temperatures to which the heat sensitive device will be ultimately exposed; and the thermal sensitivity of the heat sensitive device.

Thus, for example, if a flight recorder contains electronics made of materials that are particularly sensitive to high heat, one might choose to enclose the electronics completely within an endothermic and insulated enclosure, as described above. On the other hand, if the electronics are less sensitive to high heat, one might opt for the use of a single thin endothermic compound "shield", as a thermal control system.

Similarly, if the flight recorder will be exposed to very high temperatures, as for example 600° C. through 1100° C. for more than just a few minutes, one would not only choose to enclose the flight recorder within an endothermic compound "box", but one would use an endotherm from those described above that decompose within that temperature range i.e. Lithium Hydroxide, Sodium Hydroxide or Aluminum Hydroxide; or use more insulation within the "box" and pick any of the endothermic compounds disclosed above; or use multiple layers or mixtures of different endotherms, set to react at different temperatures. More importantly, however, one would have to calculate, on the basis of the formulas set forth above, the amount of the endotherm(s) that would actually have to be contained within the "box" so that it could efficiently and completely absorb the damaging thermal load, to which the flight recorder will be subjected.

On the other hand, if the flight recorder is going to be exposed to temperatures between 120° C. and 350° C., one can choose to enclose it within a boric acid "box." The amount of boric acid within the walls of the "box" or the amount of boric acid surrounding the flight recorder either through its being poured onto the flight recorder, or through its being lined onto the inner surface of the "box" can be calculated on the basis of $\Delta H_r = (53,600 \text{ Kcal}/2 \text{ mol})(2(62) \text{ g}/2 \text{ mol} \geq 432 \text{ cal/g}$. Specifically, one would have to calculate the amount of heat that the flight recorder would be exposed to over time. The method of said calculation is well known in the art. Thus, if the amount of damaging heat to which the flight recorder will be exposed over ten minutes will be 432000 cal, then the amount of boric acid surrounding the flight recorder in the box should be equal to or more than one thousand grams.

VI. Aluminum Hydroxide ($Al(OH)_3$) devices work best as a high temperature endothermic temperature control devices. When aluminum hydroxide decomposes, it leaves behind a strong thermal insulation layer of aluminum oxide (see above), which further abates a temperature rise through the decomposition products which is deposited within the heat absorbing device.

Other applications of the present invention presented, by way of example and not as a limitation include: temperature control coatings, wraps and liners, as well as thermal protection for metal and plastic structures; cooling for electronics, oven sensors, missile skins, exhaust pipes, thermal protection in race cars, fire walls, emergency cooling for nuclear reactors, guns, munitions boxes, batteries and related equipment; and in structures designed to shield life from thermal harm.

Unlike salt hydrates discussed above, hydroxides or carbonates may be stored almost indefinitely provided they are not exposed to temperatures at or above the temperature of reaction. When exposed to reduced pressure and some heat, hydrates tend to lose water, making them less likely to be fully effective as cooling agents in some aircraft applications, unless properly hermetically sealed, with allowance to permit venting of water vapor at the temperature of reaction.

All of the endothermic compounds listed and discussed above are commercially available and inexpensive. They may be easily incorporated in and integrated in CFEMs, metal mesh matrices, silicon or carbon fiber or microencapsulated in porous silicate, porous carbon bodies, or suspended in plastics such as fluoroelastomers, teflon, metals or other materials. The agents may be shaped in the form of enclosures, chips, or cakes which can be incorporated in shaped bodies, and thus, can be formed in shape and dimension as required. In some applications the agents may be formed into gels and pastes.

The special compounds of the present invention provide unforeseen, critical benefits in that they readily absorb massive quantities of heat, in a unidirectional reaction. And that once they absorb it, they do not release it, they do not reverse, and therefore cannot act as heat generating compounds. Thus, protection for heat sensitive devices is, significant and substantial within a closed environment.

Furthermore, all of these compounds produce environmentally harmless vapor products during decomposition and even at elevated temperatures. In addition, since these compounds are per se generally non-toxic (as compared to Beryllium, a material used in prior art heat sinks and which is extremely toxic) they are easier and less expensive to use in the manufacturing process of the heat absorbing devices.

Various modifications and changes have been disclosed herein, and others will be apparent to those skilled in this art. Therefore, it is to be understood that the present disclosure is by way of illustration and not limitation of the present invention.

What is claimed is:

1. A heat absorbing control device, comprising:
   (a) carbonate salt in an amount to effect sufficient heat absorption to protect a heat sensitive device from a damaging thermal load;
   (b) support means for supporting said carbonate salt, said carbonate salt being supportable in relation to said heat sensitive device by said support means;
wherein said carbonate salt effects said heat absorption at least in part based on an irreversible decomposition of said carbonate salt.

2. A heat absorbing control device according to claim 1, wherein the carbonate salt is selected from the group consisting of Lithium Carbonate, Hydrates of Lithium Carbonate, Sodium Carbonate, Hydrates of Sodium Carbonate, Potassium Carbonate, Hydrates of Potassium Carbonate, Magnesium Carbonate, Hydrates of Magnesium Carbonate, Calcium Carbonate, Hydrates of Calcium Carbonate, Beryllium Carbonate, Hydrates of Beryllium Carbonate, Aluminum Carbonate, Hydrates of Aluminum Carbonate, and mixtures thereof.

3. A heat absorbing control device according to claim 1, wherein the means for supporting said carbonate salt comprises a retaining matrix, packaging, encapsulation, microencapsulation, enclosure or structure.

4. A heat absorbing control device according to claim 1, wherein a heat sensitive device is embedded within the carbonate salt.

5. A heat absorbing control device according to claim 1, wherein the carbonate salt is surrounded by a heat sensitive device.

6. A heat absorbing control device according to claim 1, wherein the means for supporting said carbonate salt is a closed container, in which said carbonate salt is located.

7. A heat absorbing control device according to claim 6, wherein said carbonate salt lines an inner wall of the closed container.

8. A heat absorbing control device according to claim 4, wherein said heat sensitive device is located within and spaced from said carbonate salt.

9. A heat absorbing control device according to claim 1, wherein said carbonate salt is adhered to a flexible substrate, said flexible substrate being adaptable to the size and shape of a heat sensitive device in thermal communication with said carbonate salt.

10. A heat absorbing control device according to claim 1, wherein the means for supporting said carbonate salt is configured based on factors selected from the group consisting of the type of heat sensitive device to be utilized with said carbonate salt, spatial limitations associated with said heat sensitive device, the physical environment of said heat sensitive device, heat generating conditions to which said heat sensitive device will be subjected, and combinations thereof.

11. A heat absorbing control device according to claim 1, wherein said irreversible decomposition includes dehydration of said carbonate salt.

12. A heat absorbing control device according to claim 1, further comprising at least one layer of insulation placed between said heat sensitive device and said support means.

13. A heat absorbing control device according to claim 1, further comprising at least one layer of insulation placed between said support means and a source of heat.

14. A heat absorbing control device according to claim 1, further comprising a hermetic seal surrounding said support means.

15. A heat absorbing control device according to claim 14, wherein said hermetic seal includes a vent.

16. A heat absorbing control device according to claim 1, wherein said carbonate salt is Lithium Carbonate.

17. A heat absorbing control device according to claim 1, wherein said carbonate salt is a Hydrate of Lithium Carbonate.

18. A heat absorbing control device according to claim 1, wherein said carbonate salt is Sodium Carbonate.

19. A heat absorbing control device according to claim 1, wherein said carbonate salt is a Hydrate of Sodium Carbonate.

20. A heat absorbing control device according to claim 1, wherein said carbonate salt is Potassium Carbonate.

21. A heat absorbing control device according to claim 1, wherein said carbonate salt is a Hydrate of Potassium Carbonate.

22. A heat absorbing control device according to claim 1, wherein said carbonate salt is Magnesium Carbonate.

23. A heat absorbing control device according to claim 1, wherein said carbonate salt is a Hydrate of Magnesium Carbonate.

24. A heat absorbing control device according to claim 1, wherein said carbonate salt is Calcium Carbonate.

25. A heat absorbing control device according to claim 1, wherein said carbonate salt is a Hydrate of Calcium Carbonate.

26. A heat absorbing control device according to claim 1, wherein said carbonate salt is Beryllium Carbonate.

27. A heat absorbing control device according to claim 1, wherein said carbonate salt is a Hydrate of Beryllium Carbonate.

28. A heat absorbing control device according to claim 1, wherein said carbonate salt is Aluminum Carbonate.

29. A heat absorbing control device according to claim 1, wherein said carbonate salt is a Hydrate of Aluminum Carbonate.

30. A heat absorbing control device, comprising:

carbonate salt in an amount to effect sufficient heat absorption to protect a heat sensitive device from a damaging thermal load, said carbonate salt being formed into an endothermic structure that is effective to absorb said heat at least in part based on an irreversible decomposition of said carbonate salt.

31. A heat absorbing control device according to claim 30, wherein said carbonate salt is selected from the group consisting of Lithium Carbonate, Hydrates of Lithium Carbonate, Sodium Carbonate, Hydrates of Sodium Carbonate, Potassium Carbonate, Hydrates of Potassium Carbonate, Magnesium Carbonate, Hydrates of Magnesium Carbonate, Calcium Carbonate, Hydrates of Calcium Carbonate, Beryllium Carbonate, Hydrates of Beryllium Carbonate, Aluminum Carbonate, Hydrates of Aluminum Carbonate, and mixtures thereof.

32. A heat absorbing control device according to claim 30, further comprising a heat sensitive device in thermal communication with said carbonate salt, and wherein the heat sensitive device is embedded within said endothermic structure.

33. A heat absorbing control device according to claim 30, wherein said carbonate salt is Lithium Carbonate.

34. A heat absorbing control device according to claim 30, wherein said carbonate salt is a Hydrate of Lithium Carbonate.

35. A heat absorbing control device according to claim 30, wherein said carbonate salt is Sodium Carbonate.

36. A heat absorbing control device according to claim 30, wherein said carbonate salt is a Hydrate of Sodium Carbonate.

37. A heat absorbing control device according to claim 30, wherein said carbonate salt is Potassium Carbonate.

38. A heat absorbing control device according to claim 30, wherein said carbonate salt is a Hydrate of Potassium Carbonate.

39. A heat absorbing control device according to claim 30, wherein said carbonate salt is Magnesium Carbonate.

40. A heat absorbing control device according to claim 30, wherein said carbonate salt is a Hydrate of Magnesium Carbonate.

41. A heat absorbing control device according to claim 30, wherein said carbonate salt is Calcium Carbonate.

42. A heat absorbing control device according to claim 30, wherein said carbonate salt is a Hydrate of Calcium Carbonate.

43. A heat absorbing control device according to claim 30, wherein said carbonate salt is Beryllium Carbonate.

44. A heat absorbing control device according to claim 30, wherein said carbonate salt is a Hydrate of Beryllium Carbonate.

45. A heat absorbing control device according to claim 30, wherein said carbonate salt is Aluminum Carbonate.

46. A heat absorbing control device according to claim 30, wherein said carbonate salt is a Hydrate of Aluminum Carbonate.

47. In combination:

(a) a heat absorbing control device that includes carbonate salt in an amount to effect sufficient heat absorption to protect a heat sensitive device from a damaging thermal load; and (b) a heat sensitive device in thermal communication with said heat absorbing control device;

wherein said carbonate salt is supported in relation to said heat sensitive device, and wherein said carbonate salt effects said heat absorption at least in part based on an irreversible decomposition of said carbonate salt.

48. A combination according to claim 47, wherein said heat sensitive device is selected from the group consisting of a flight recorder, a metal structure, a plastic structure, an electronic device, an oven sensor, a missile skin, an exhaust pipe, a race car component, a fire wall, a nuclear reactor component, a gun, a munitions box, a battery and body protective structure.

49. A combination according to claim 48, wherein said heat absorbing control device includes a support means for supporting said carbonate salt in relation to said heat sensitive device.

* * * * *